(12) United States Patent
Lin et al.

(10) Patent No.: US 12,733,465 B2
(45) Date of Patent: Sep. 8, 2026

(54) CONDUCTIVE STRUCTURES AND METHODS OF FORMING THE SAME

(71) Applicant: Taiwan Semiconductor Manufacturing Company, Ltd., Hsinchu (TW)

(72) Inventors: Kan-Ju Lin, Kaohsiung City (TW); Hao-Heng Liu, Hsinchu City (TW); Chien Chang, Hsinchu (TW); Hung-Yi Huang, Hsin-chu City (TW); Harry Chien, Chandler, AZ (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1130 days.

(21) Appl. No.: 17/805,605

(22) Filed: Jun. 6, 2022

(65) Prior Publication Data

US 2023/0395429 A1 Dec. 7, 2023

(51) Int. Cl.

| | |
|---|---|
| ***H10W 20/00*** | (2026.01) |
| ***C23C 16/14*** | (2006.01) |
| ***C23C 16/56*** | (2006.01) |
| ***H10W 20/42*** | (2026.01) |
| *H10W 20/41* | (2026.01) |
| *H10W 20/44* | (2026.01) |

(52) U.S. Cl.

CPC ........... *H10W 20/045* (2026.01); *C23C 16/14* (2013.01); *C23C 16/56* (2013.01); *H10W 20/033* (2026.01); *H10W 20/043* (2026.01); *H10W 20/054* (2026.01); *H10W 20/42* (2026.01); *H10W 20/062* (2026.01); *H10W 20/425* (2026.01); *H10W 20/4403* (2026.01)

(58) Field of Classification Search

None

See application file for complete search history.

(56) References Cited

U.S. PATENT DOCUMENTS

| | | | |
|---|---|---|---|
| 10,727,117 | B2 | 7/2020 | Liao et al. |
| 10,867,848 | B2 | 12/2020 | Wu et al. |
| 11,107,896 | B2 | 8/2021 | Huang et al. |

(Continued)

FOREIGN PATENT DOCUMENTS

| | | |
|---|---|---|
| TW | 201923977 A | 6/2019 |
| TW | 201937675 A | 9/2019 |

(Continued)

*Primary Examiner* — Bradley Smith

(74) *Attorney, Agent, or Firm* — Harrity & Harrity, LLP

(57) ABSTRACT

Depositing a seed layer after formation of the MD in order to reduce or prevent epitaxial growth of the seed layer toward the MD. For example, the seed layer may be deposited using CVD and conformal dry etching. In some implementations, the seed layer may be formed of ruthenium (Ru), molybdenum (Mo), or tungsten (W). Accordingly, the seed layer helps reduce or prevent seam formation in the VG, which reduces resistance of the VG by allowing for bottom-up metal growth. Additionally, current leakage from the VG to the MD is reduced or even prevented. As a result, device performance and efficiency are increased and breakdown voltage of the gate structure is also increased. Additionally, because electrical shorts are less likely, yield is increased, which conserves power, raw materials, and processing resources that otherwise would have been consumed during manufacture.

20 Claims, 19 Drawing Sheets

420

500

(56) References Cited

U.S. PATENT DOCUMENTS

| | | | | |
|---|---|---|---|---|
| 11,239,114 | B2 | 2/2022 | Tsai et al. | |
| 11,532,509 | B2 | 12/2022 | Wu et al. | |
| 2011/0068475 | A1* | 3/2011 | de Fresart | H01L 21/76879<br>257/E23.141 |
| 2019/0157141 | A1* | 5/2019 | Liao | H10D 30/6219 |
| 2019/0164866 | A1* | 5/2019 | Yan | H10D 30/6219 |
| 2021/0057359 | A1* | 2/2021 | Hu | H01L 21/76895 |
| 2021/0104433 | A1* | 4/2021 | Mukherjee | H01L 21/76843 |
| 2021/0134671 | A1* | 5/2021 | Xie | H01L 21/76834 |
| 2021/0257479 | A1* | 8/2021 | Chang | H01L 21/02658 |
| 2022/0190129 | A1* | 6/2022 | Wei | H10D 62/235 |

FOREIGN PATENT DOCUMENTS

| | | | |
|---|---|---|---|
| TW | 201946148 | A | 12/2019 |
| TW | 202021002 | A | 6/2020 |
| TW | 202114230 | A | 4/2021 |
| TW | 202129723 | A | 8/2021 |

* cited by examiner

410

420

500

CONDUCTIVE STRUCTURES AND METHODS OF FORMING THE SAME

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
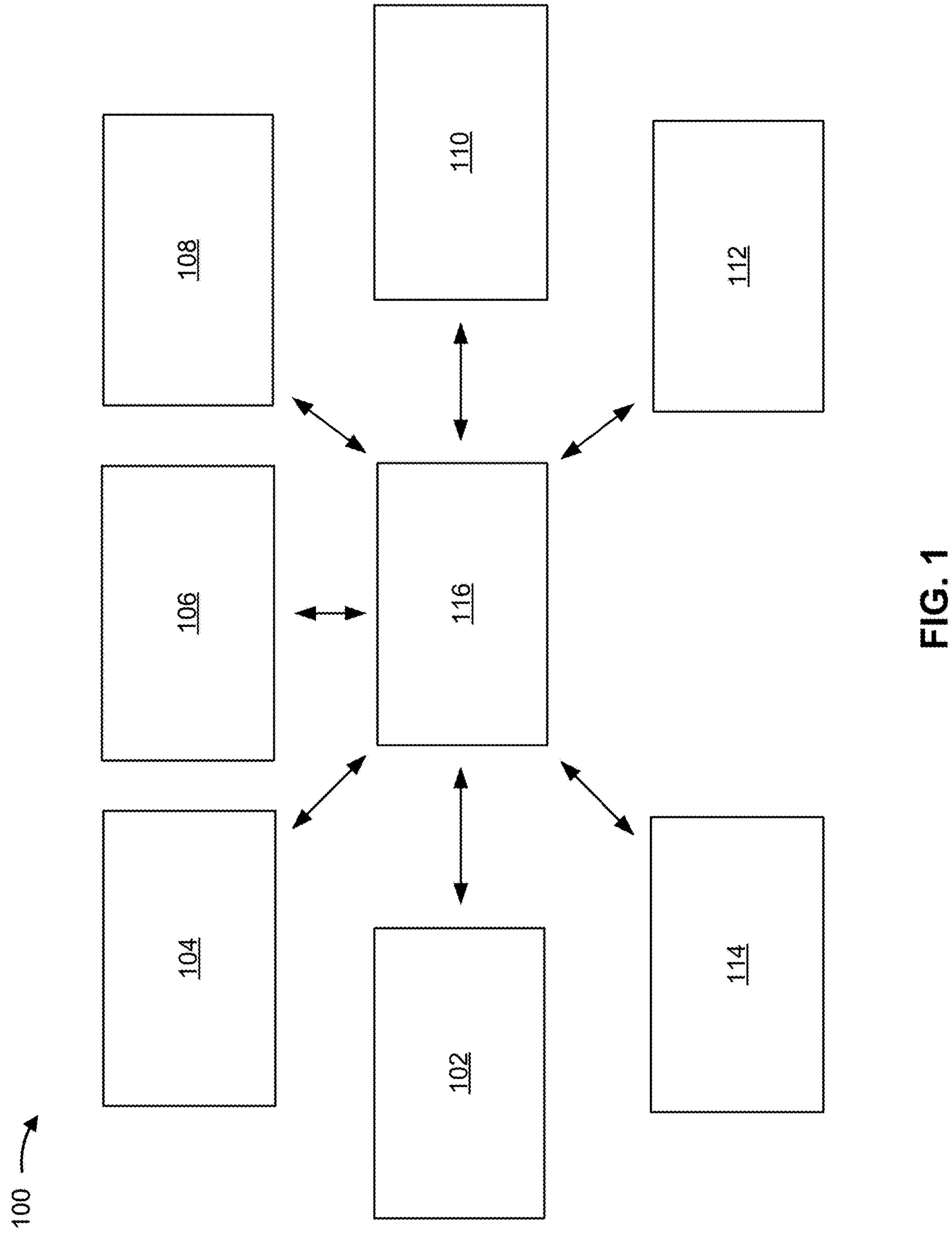
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "cupper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

After formation of a gate structure (also referred to as an "MG") for a semiconductor structure, an interconnect (also referred to as a gate via or "VG") is formed to contact the gate structure. In order to provide improved electrical contact between the MG and the VG, a metal seed layer is deposited before formation of a neighboring drain contact (also referred to as an "MD"). However, epitaxial growth of the seed layer may extend laterally toward the MD. As a result, current may leak from the VG to the MD, which reduces efficiency and breakdown voltage of the gate structure. In some cases, the VG may suffer an electrical short if the seed layer extends too far.

Some implementations described herein provide techniques and apparatuses for depositing a seed layer after formation of the MD in order to reduce or prevent epitaxial growth of the seed layer toward the MD. For example, the seed layer may be deposited using conformal chemical vapor deposition (CVD) and conformal dry etching. In some implementations, the seed layer may be formed of ruthenium (Ru), molybdenum (Mo), or tungsten (W). Accordingly, the seed layer helps reduce or prevent seam formation in the VG, which reduces resistance of the VG by allowing for bottom-up metal growth. Additionally, current leakage from the VG to the MD is reduced or even prevented. As a result, device performance and efficiency are increased and breakdown voltage of the gate structure is also increased. Additionally, because electrical shorts are less likely, yield is increased, which conserves power, raw materials, and processing resources that otherwise would have been consumed during manufacture.

FIG. 1 is a diagram of an example environment 100 in which systems and/or methods described herein may be implemented. The example environment 100 includes semiconductor processing tools that can be used to form semiconductor structures and devices, such as a conductive structure as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may include a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

One or more of the semiconductor processing tools 102-112 may perform a series of operations. For example, and as described in greater detail in connection with FIGS. 5A-5K and elsewhere herein, the series of operations may include forming a recess in at least one dielectric layer and adjacent to a source/drain structure. The series of operations may further include forming a seed layer within the recess using conformal CVD, the seed layer comprising a metal lacking substrate dependency and etching the seed layer from sidewalls of the recess to expose a surface of a gate structure. The series of operations may therefore include forming a gate via within the recess and over the exposed surface of the gate structure.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
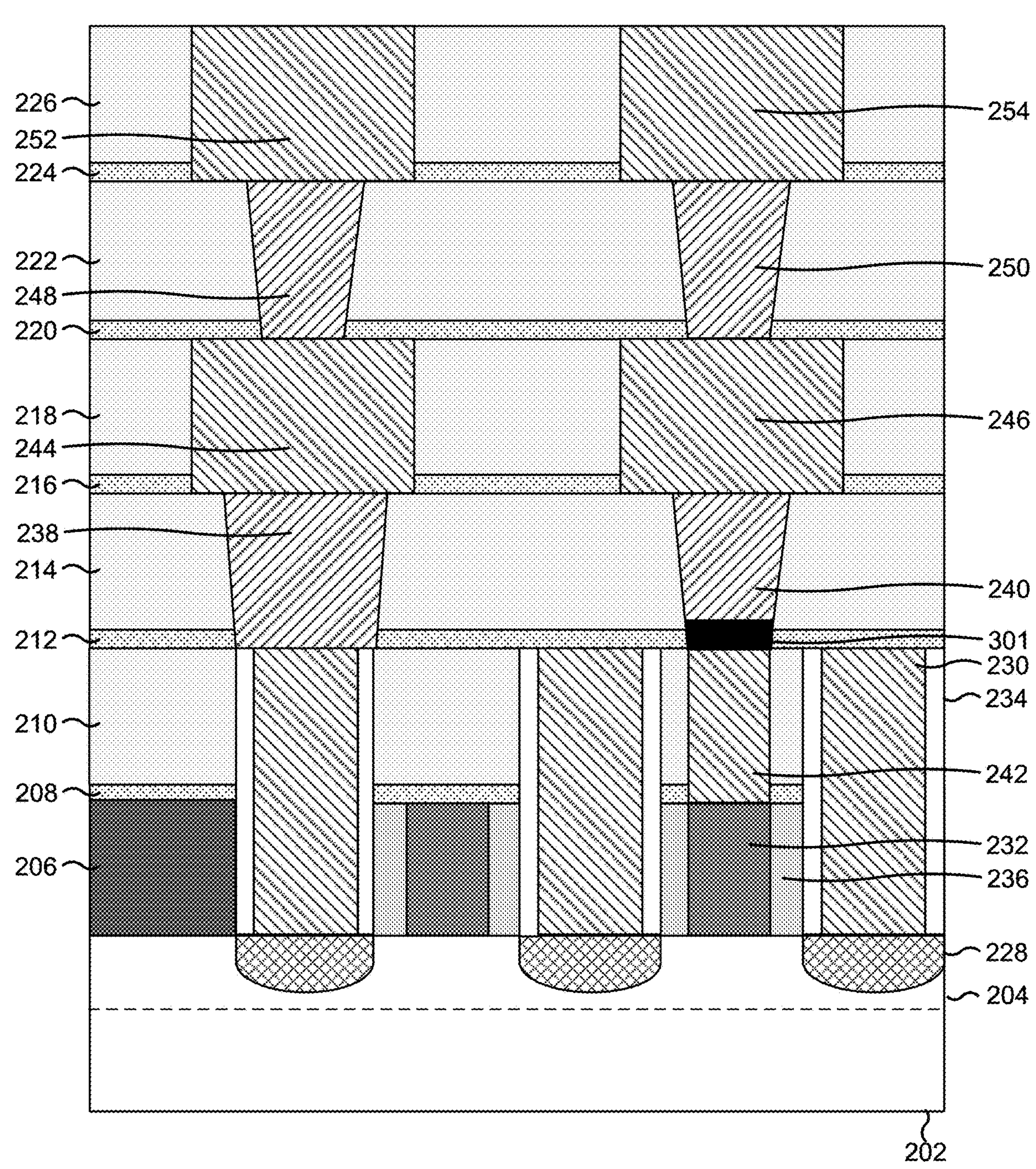
FIG. 2 is a diagram of an example semiconductor structure described herein.

FIG. 2 is a diagram of a portion of an example device 200 described herein. Device 200 includes an example of a memory device, a logic device, a processor, an input/output device, and/or another type of semiconductor device that includes one or more transistors.

The device 200 may include a substrate 202, an active layer, and one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 may include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the device 200 (or the layers included therein) to be selectively etched or protected from etching to form one or more of the structures included in the device 200. For example, the ESLs 208, 212, 216, 220, and 224 may each include silicon nitride ($SiN_x$), an oxide (e.g., a silicon oxide ($SiO_x$), silicon oxynitride ($SiO_xN_x$) metal oxide, and/or metal oxynitride.

As an example in FIG. 2, the device 200 may include a plurality of epitaxial (epi) regions 228 that are grown and/or otherwise formed on and/or around portions of a fin structure 204 of the substrate 202. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the device 200 and may be referred to as a front end of line (FEOL) region.

The epitaxial regions 228 are electrically connected to metal source or drain contacts 230 of the transistors included in the device 200. The metal source or drain contacts (MDs) 230 include cobalt (Co), ruthenium (Ru), and/or another conductive or metal material. The transistors further include gates 232, which are formed of a polysilicon material, a metal (e.g., tungsten (W) or another metal), and/or another type of conductive material. In some implementations, the gates 232 may comprise multiple layers of material, such as multiple layers of metal or multiple layers including at least one polysilicon layer and at least one metal layer, among other examples. The metal source or drain contacts 230 and the gates 232 are electrically isolated by one or more sidewall spacers, including spacers 234 on each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects (e.g., in a middle end of line (MEOL) region). The interconnects electrically connect the transistors of the device 200 and/or electrically connect the transistors to other areas and/or components of the device 200. In some implementations, the interconnects electrically connect the transistors to a back end of line (BEOL) region of the device 200.

The metal source or drain contacts 230 are electrically connected to source or drain interconnects 238 (e.g., source or drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of MEOL and BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the device 200 include additional metallization layers and/or vias that connect the device 200 to a package.

As further shown in FIG. 2 and described in further detail in connection with FIG. 3, the device 200 includes a seed layer 301. The seed layer 301 allows for formation of the gate via 240 substantially free of seams. As used herein, "substantially free" refers to a lack of seams that are wider than 0.1 nanometers (nm) and longer than 1 nm. For example, the gate via 240 may have an aspect ratio of at least 2 such that seams would generally form without the seed layer 301. By selecting an aspect ratio of at least 2, efficiency and breakdown voltage of the gate 232 are increased. Moreover, reducing or preventing seams in the gate via 240 reduces resistance of the gate via 240. Similarly, the seed layer 301 forms an interface with the gate via 240 that is substantially free of voids. As used herein, "void" refers to a gap that has a width in a range from approximately 2.2 nm to approximately 10 nm. As used herein, "substantially free" refers to no more than one void at the interface. Reducing or preventing voids reduces resistance at the interface.

In some implementations, a height of the gate via 240 may be approximately two to approximately thirty times as tall as a height of the seed layer 301. By selecting a height for the gate via 240 at least two times as tall as a height of the seed layer 301, the gate via 240 remains sufficiently tall to achieve an aspect ratio of at least 2. By selecting a height for the gate via 240 no more than thirty times as tall as a height of the seed layer 301, the seed layer 301 is sufficiently tall to reduce or prevent seams from forming in the gate via 240; otherwise, the seed layer 301 would not fill enough of a corresponding recess (e.g., recess 503 as described in connection with FIGS. 5H-5J) to reduce or prevent seams from forming in the gate via 240.

As further shown in FIG. 2, a bottom surface of the gate via 240 has a width approximately equal to a width of a top surface of the seed layer 301. As a result, current leakage from the gate via 240 to the MD 230 is reduced or even eliminated. In some implementations, a top surface of the seed layer 301 is higher than a top surface of the ESL 212 adjacent to the seed layer 301. For example, as described in connection with FIGS. 5A-5K, the seed layer 301 may be formed after the MD 230 is formed such that the seed layer 301 may be taller than the ESL 212*a*, which helps keep the gate via 240 free of seams even as the aspect ratio of the gate via 240 increases. Alternatively, a top surface of the seed layer 301 may be approximately level with the top surface of the ESL 212 adjacent to the seed layer (e.g., as shown in FIG. 3).

As indicated above, FIG. 2 is provided as an example. Other examples may differ from what is described with regard to FIG. 2.

Figure 3:
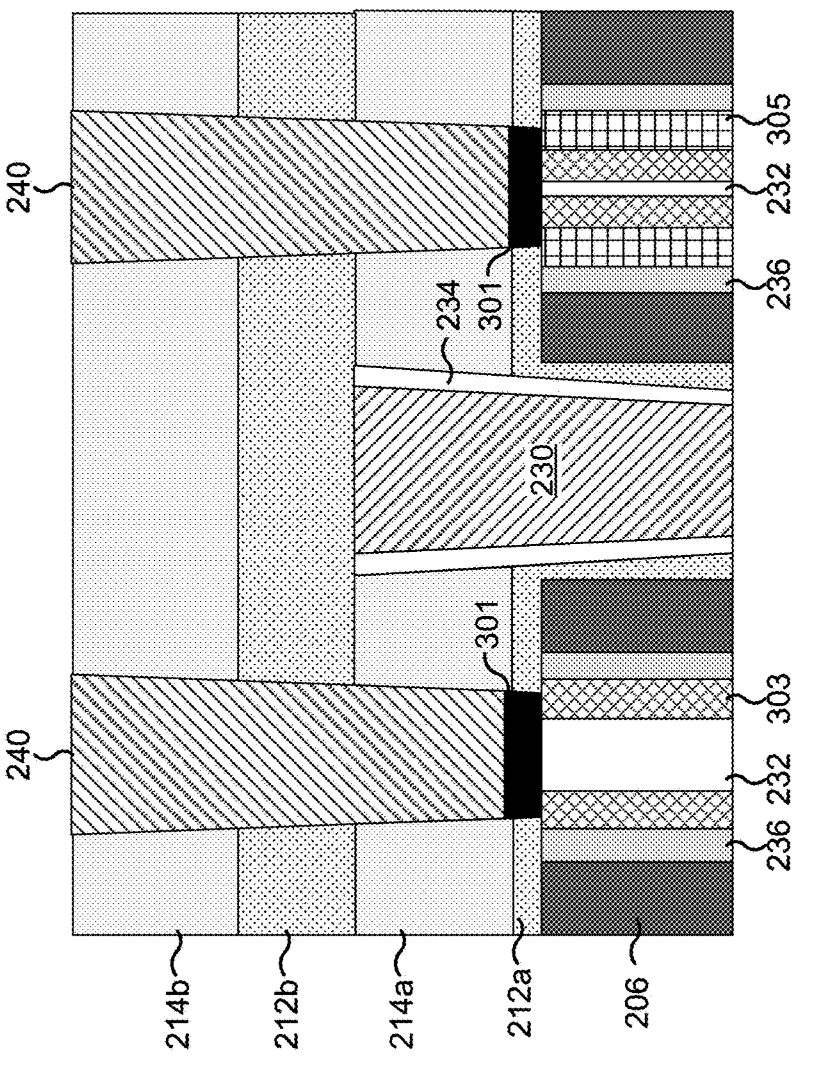
FIG. 3 is a diagram of an example semiconductor structure described herein.

FIG. 3 is a diagram of an example semiconductor structure 300 described herein. The semiconductor structure 300 includes gate vias 240 that are formed with seed layers 301 over gate structures 232 and adjacent to MD 230. As shown in FIG. 3, the gate vias 240 may be formed in a dielectric layer 214*a* above an ESL 212*a* and formed in a dielectric layer 214*b* above an ESL 212*b*. Each dielectric layer 214*a* and 214*b* may include lanthanum oxide (LaO), aluminum oxide (AlO), yttrium oxide (YO), tantalum carbonitride (TaCN), zirconium silicide (ZrSi), silicon oxycarbonitride (SiOCN), silicon oxycarbide (SiOC), silicon carbonitride (SiCN), zirconium nitride (ZrN), zirconium-aluminum oxide (ZrAlO), titanium oxide (TiO), tantalum oxide (TaO), zirconium oxide (ZrO), hafnium oxide (HfO), silicon nitride (SiN), hafnium silicide (HfSi), aluminum oxynitride (AlON), silicon oxide (SiO), silicon carbide (SiC), and/or zinc oxide (ZnO). Similarly, each ESL 212*a* and 212*b* may include one or more of lanthanum oxide (LaO), aluminum oxide (AlO), yttrium oxide (YO), tantalum carbonitride (TaCN), zirconium silicide (ZrSi), silicon oxycarbonitride (SiOCN), silicon oxycarbide (SiOC), silicon carbonitride (SiCN), zirconium nitride (ZrN), zirconium-aluminum oxide (ZrAlO), titanium oxide (TiO), tantalum oxide (TaO), zirconium oxide (ZrO), hafnium oxide (HfO), silicon nitride (SiN), hafnium silicide (HfSi), aluminum oxynitride (AlON), silicon oxide (SiO), silicon carbide (SiC), and/or zinc oxide (ZnO). A ratio of a height of the dielectric layer 214*a* (and/or of the dielectric layer 214*b*) to a height of the ESL 212*a* (and/or of the ESL 212*b*) may be in a range from approximately 1.0 to approximately 13.4. By selecting a ratio of at least 1.0, the dielectric layer 214*a* (and/or the dielectric layer 214*b*) is large enough to support the gate via 240 with an aspect ratio of at least 2. By selecting a ratio of no more than 13.4, the ESL 212*a* (and/or the ESL 212*b*) is large enough to halt an etching process. For example, a height of the ESL 212*a* (and/or of the ESL 212*b*) may be in a range from approximately 3 nm to approximately 20 nm. Similarly, a height of the dielectric layer 214*a* (and/or of the dielectric layer 214*b*) may be in range from approximately 3 nm to approximately 40 nm.

Although shown as a single layer, each ESL 212*a* and 212*b* may alternatively comprise a multi-layer ESL formed of a combination of materials above. Alternatively, some implementations may omit the ESL 212*a* and/or the ESL 212*b* (e.g., when the gate vias 240 are formed using self-assembling techniques).

As further shown in FIG. 3, the MD 230 may be surrounded by a spacer 234. The spacer 234 may be formed of lanthanum oxide (LaO), aluminum oxide (AlO), yttrium oxide (YO), tantalum carbonitride (TaCN), zirconium silicide (ZrSi), silicon oxycarbonitride (SiOCN), silicon oxycarbide (SiOC), silicon carbonitride (SiCN), zirconium nitride (ZrN), zirconium-aluminum oxide (ZrAlO), titanium oxide (TiO), tantalum oxide (TaO), zirconium oxide (ZrO), hafnium oxide (HfO), silicon nitride (SiN), hafnium silicide (HfSi), aluminum oxynitride (AlON), silicon oxide (SiO), silicon carbide (SiC), and/or zinc oxide (ZnO). The spacer 234 may help electrically insulate the MD 230 from the gate vias 240.

As further shown in FIG. 3, the gate 232 may be surrounded by a spacer 236. A ratio of the width of the gate 232 to a width of the spacer 236 may be in a range from approximately 0.01 to approximately 100. The gate 232 may be formed of lanthanum oxide (LaO), aluminum oxide (AlO), yttrium oxide (YO), tantalum carbonitride (TaCN), zirconium silicide (ZrSi), silicon oxycarbonitride (SiOCN), silicon oxycarbide (SiOC), silicon carbonitride (SiCN), zirconium nitride (ZrN), zirconium-aluminum oxide (ZrAlO), titanium oxide (TiO), tantalum oxide (TaO), zirconium oxide (ZrO), hafnium oxide (HfO), silicon nitride (SiN), hafnium silicide (HfSi), aluminum oxynitride (AlON), silicon oxide (SiO), silicon carbide (SiC), and/or zinc oxide (ZnO), hafnium-aluminum oxide (HfAlO), molybdenum nitride (MoN), tungsten nitride (WN), platinum (Pt), and/or aluminum (Al). Similarly, the spacer 236 may be formed of lanthanum oxide (LaO), aluminum oxide (AlO), yttrium oxide (YO), tantalum carbonitride (TaCN), zirconium silicide (ZrSi), silicon oxycarbonitride (SiOCN), silicon oxycarbide (SiOC), silicon carbonitride (SiCN), zirconium nitride (ZrN), zirconium-aluminum oxide (ZrAlO), titanium oxide (TiO), tantalum oxide (TaO), zirconium oxide (ZrO), hafnium oxide (HfO), silicon nitride (SiN), hafnium silicide (HfSi), aluminum oxynitride (AlON), silicon oxide (SiO), silicon carbide (SiC), and/or zinc oxide (ZnO), hafnium-aluminum oxide (HfAlO), molybdenum nitride (MoN), tungsten nitride (WN), platinum (Pt), and/or aluminum (Al).

Additionally, as shown in FIG. 3, the gate 232 may be multi-layered and thus include one or more additional layers 303 and/or 305. A ratio of the width of the gate 232 to a width of the additional layer 303 (and/or the additional layer 305) may be in a range from approximately 0.01 to approximately 100. Each additional layer 303 and 305 may be formed of lanthanum oxide (LaO), aluminum oxide (AlO), yttrium oxide (YO), tantalum carbonitride (TaCN), zirconium silicide (ZrSi), silicon oxycarbonitride (SiOCN), silicon oxycarbide (SiOC), silicon carbonitride (SiCN), zirconium nitride (ZrN), zirconium-aluminum oxide (ZrAlO), titanium oxide (TiO), tantalum oxide (TaO), zirconium oxide (ZrO), hafnium oxide (HfO), silicon nitride (SiN), hafnium silicide (HfSi), aluminum oxynitride (AlON), silicon oxide (SiO), silicon carbide (SiC), and/or zinc oxide (ZnO), hafnium-aluminum oxide (HfAlO), molybdenum nitride (MoN), tungsten nitride (WN), platinum (Pt), and/or aluminum (Al).

As described in connection with FIG. 5I, the seed layer 301 may comprise tungsten (W), molybdenum (Mo), and/or ruthenium (Ru). Additionally, the gate via 240 may be formed of a different material, such as aluminum (Al), titanium (Ti), titanium nitride (TiN), copper (Cu), cobalt (Co). Additionally or alternatively, the gate via 240 may be selected from any of tungsten (W), molybdenum (Mo), and/or ruthenium (Ru) that are not included in the seed layer 301. As a result, the seed layer 301 allows for a multi-material gate contact to be formed. Alternatively, the seed layer 301 and the gate via 240 may be formed of a same material. As a result, the seed layer 301 allows for bottom-up filling with the material without formation of a seam in the gate via 240.

As indicated above, FIG. 3 is provided as an example. Other examples may differ from what is described with regard to FIG. 3.

Figure 4A:
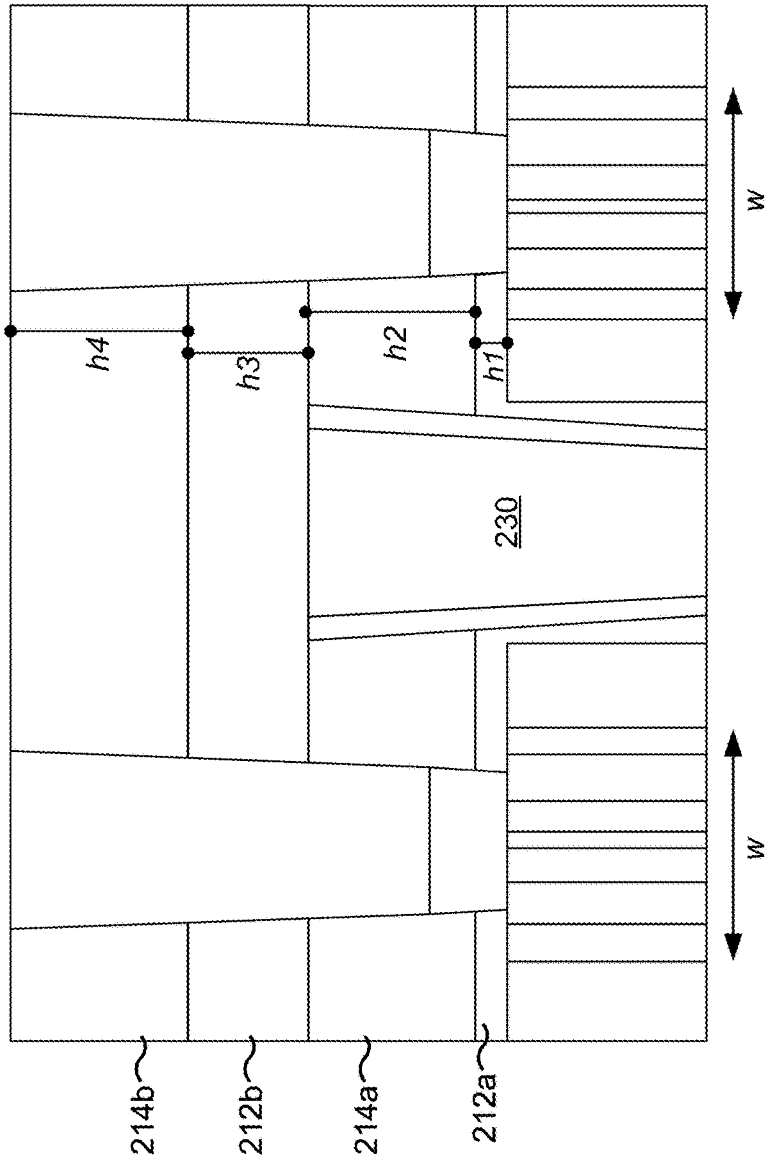
FIGS. 4A-4C are diagrams of an example implementation described herein.

FIG. 4A illustrates an example semiconductor structure 400 described herein. Semiconductor structure 400 is structurally similar to semiconductor structure 300, described in connection with FIG. 3. As shown in FIG. 4A, the ESL 212*a* has a height h1 that is in a range from approximately 3 nm to approximately 20 nm, and the dielectric layer 214*a* has a height h2 that is in a range from approximately 3 nm to approximately 40 nm. Similarly, the ESL 212*b* has a height h3 that is in a range from approximately 3 nm to approximately 20 nm, and the dielectric layer 214*b* has a height h4 that is in a range from approximately 3 nm to approximately 40 nm. As further shown in FIG. 4A, gate structures (e.g., each including a gate 232, a spacer 236, an additional layer 303, and/or an additional layer 305) may each have a width w in a range from approximately 2 nm to approximately 50 nm.

Figure 4B:
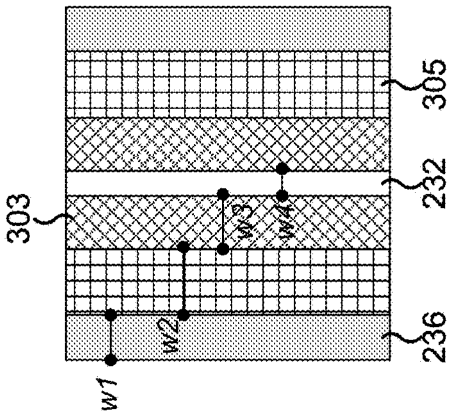
Figure 4B:
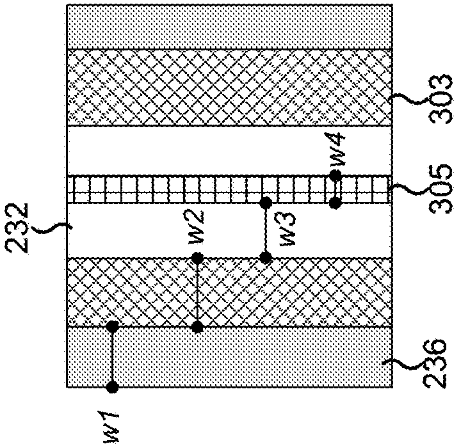

FIG. 4B illustrates example gate structures 410 described herein. The gate structures 410 may be included in semiconductor structure 300, described in connection with FIG. 3. As shown in FIG. 4B, the multi-layered gate structures may each include a gate 232, a spacer 236, an additional layer 303, and/or an additional layer 305. The gate 232, the additional layer 303, and the additional layer 305 may be arranged in any order within the spacer 236; two examples are shown in FIG. 4B. The spacer 236 may a width w1 in a range from approximately 0.1 nm to approximately 10 nm. Similarly, each of the gate 232, the additional layer 303, and/or the additional layer 305 may be associated with a width w2, w3, and/or w4 in a range from approximately 0.1 nm to approximately 10 nm.

Figure 4C:
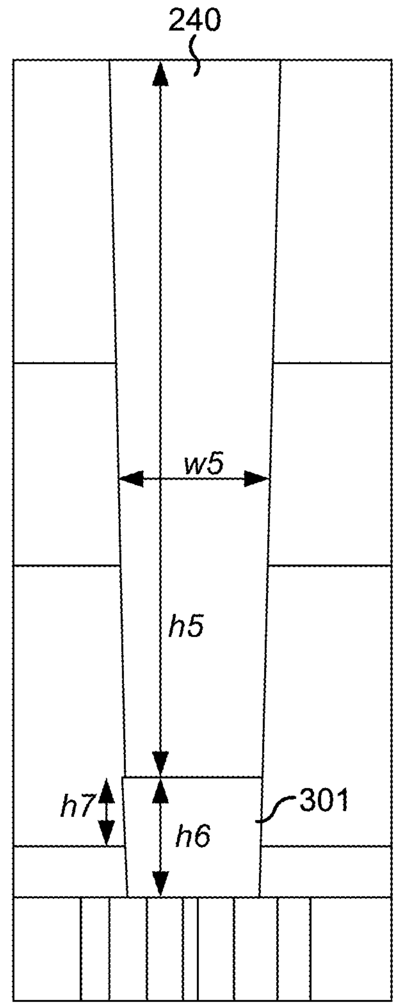

FIG. 4C illustrates an example gate via structure 420 described herein. The gate via structure 420 may be included in semiconductor structure 300, described in connection with FIG. 3. As shown in FIG. 4C, the gate via 240 has a height h5 that is in a range from approximately 5 nm to approximately 40 nm. Additionally, the gate via 240 has a width w5 such that an aspect ratio of the gate via 240 is at least 2. The aspect ratio represents a ratio between a height (e.g., h5) of a structure and a width (e.g., w5) of a structure. Generally, the aspect ratio is calculated at a midpoint (or within a few nm of the midpoint) of the structure. For example, for gate via structure 420, the aspect ratio may be calculated at or near a midpoint of the gate via 240 or may be calculated at or near a midpoint assuming the gate via 240 and the seed layer 301 are a single structure.

Similarly, the seed layer 301 has a height h6 that is in a range from approximately 5 nm to approximately 40 nm. Additionally, the gate via 240 may be higher than an adjacent ESL (e.g., ESL 212*a*) by an amount h7. h7 may be in a range from approximately 0.1 nm to approximately 37 nm.

As indicated above, FIGS. 4A-4C are provided as examples. Other examples may differ from what is described with regard to FIGS. 4A-4C.

FIGS. 5A-5K are diagrams of an example implementation 500 described herein. Example implementation 500 may be an example process for forming gate vias 240 over gates 232 and with seed layers 301. The seed layers 301 reduce or prevent seam formation in the gate vias 240 in order to reduce resistance, which in turn increases electrical performance of an electronic device including the gate vias 240.

Figure 5A:
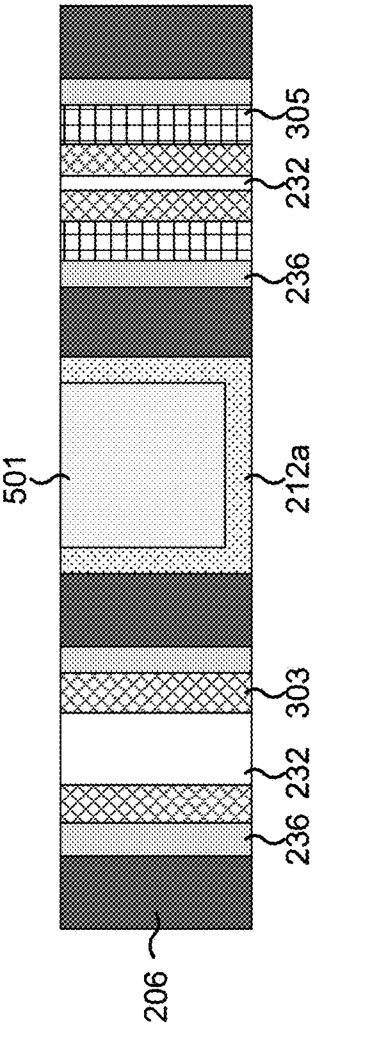
FIGS. 5A-5K are diagrams of an example implementation described herein.

As shown in FIG. 5A, the example process for forming the gate vias 240 may be performed in connection with an FEOL. In some implementations, the FEOL includes gates 232. Additional layers 303 and/or 305 may be additionally included within spacers 236. The gates 232 may be formed in a dielectric layer 206. Additionally, an ESL 212*a* and a dielectric layer 501 may occupy a volume for formation of an MD 230.

Figure 5B:
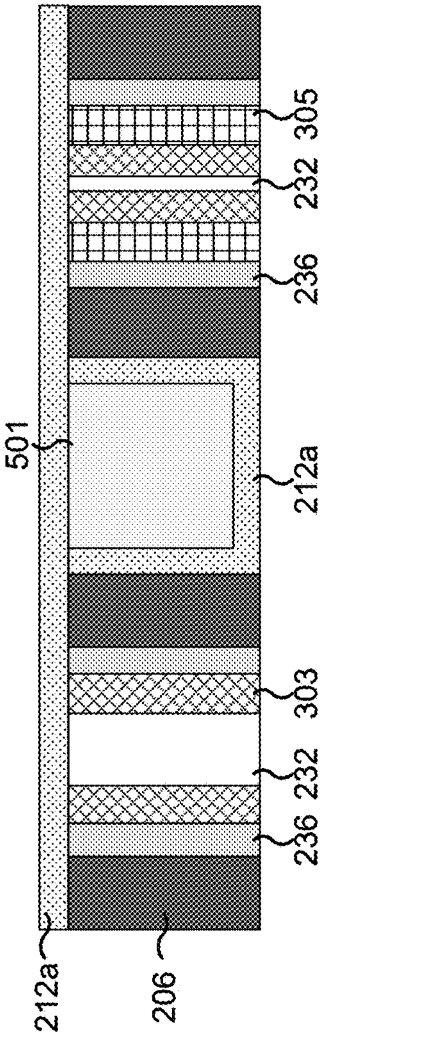

As shown in FIG. 5B, the ESL 212*a* may be extended over the gates 232. The deposition tool 102 may deposit additional material for the ESL 212*a* using a CVD technique, a PVD technique, an ALD technique, or another type of deposition technique. The planarization tool 110 may planarize the ESL 212*a* after the ESL 212*a* is extended.

Figure 5C:
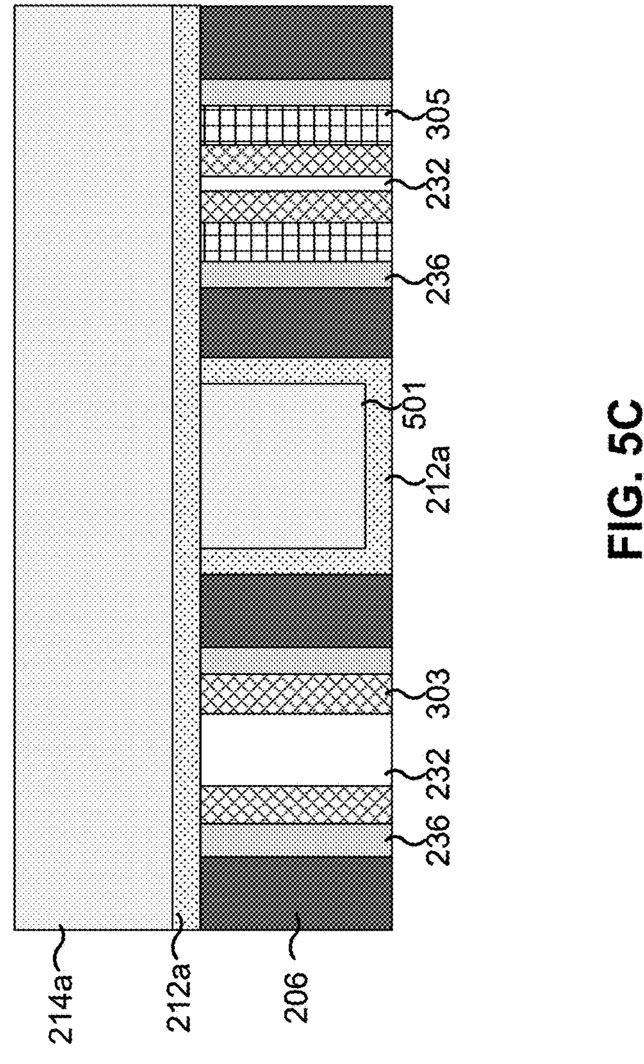

As shown in FIG. 5C, a dielectric layer 214*a* may be formed over the ESL 212*a*. For example, the deposition tool 102 may deposit the dielectric layer 214*a* using a CVD technique, a PVD technique, an ALD technique, or another type of deposition technique. The planarization tool 110 may planarize the dielectric layer 214*a* after the dielectric layer 214*a* is deposited.

Figure 5D:
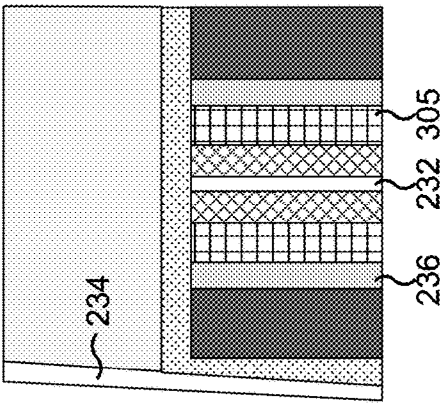
Figure 5D:
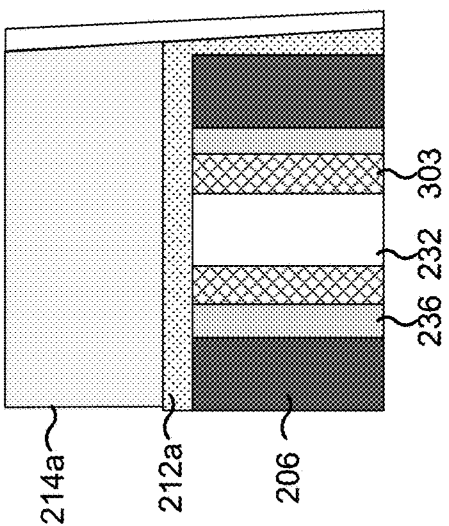

As shown in FIG. 5D, the dielectric layer 214*a* and the dielectric layer 501 may be etched to form an opening adjacent to the gates 232. In some implementations, a surface of a source/drain may be exposed. For example, the deposition tool 102 may form a photoresist layer on the dielectric layer 214*a* (or on an ESL formed on the dielectric layer 214*a*), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 214*a*. In some implementations, a photoresist removal tool removes the remaining portions of the photoresist layer (e.g., using a chemical stripper, a plasma asher, and/or another technique) after the etch tool 108 etches the dielectric layers 214*a* and 501.

Additionally, as further shown in FIG. 5D, spacer 234 may be formed. For example, the deposition tool 102 may deposit the spacer 234 using a CVD technique, a PVD technique, an ALD technique, or another type of deposition technique. The spacer 234 may be formed using a precursor material that is selective such that the spacer 234 forms on the dielectric layer 214*a* and the ESL 212*a* but not on the exposed surface of the source/drain. The planarization tool 110 may remove (e.g., via CMP) any material of the spacer 234 formed on a horizontal surface of the dielectric layer 214*a*.

Figure 5E:
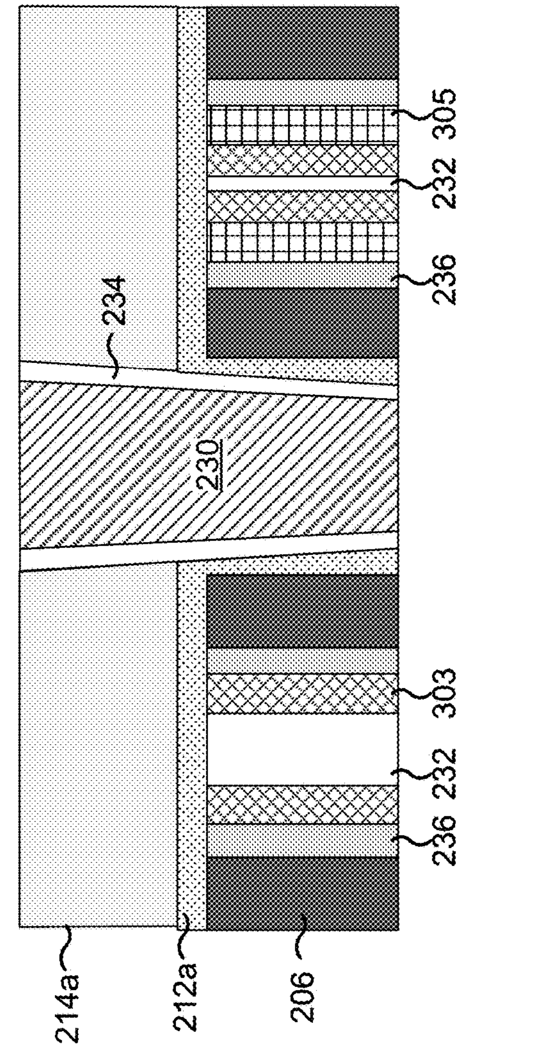

As shown in FIG. 5E, the MD 230 may be formed. The deposition tool 102 may deposit material of the MD 230 using a CVD technique, a PVD technique, an ALD technique, or another type of deposition technique, the plating tool 112 may deposit the material of the MD 230 using an electroplating operation, or a combination thereof.

In some implementations, the material of the MD 230 also flows over the dielectric layer 214*a*. Accordingly, the MD 230 may be planarized. The planarization tool 110 may planarize the MD 230 after the MD 230 is deposited. Additionally, portions of the MD 230 deposited over the dielectric layer 214*a* may be removed during planarization. In some implementations, the planarization tool 110 uses CMP.

Figure 5F:
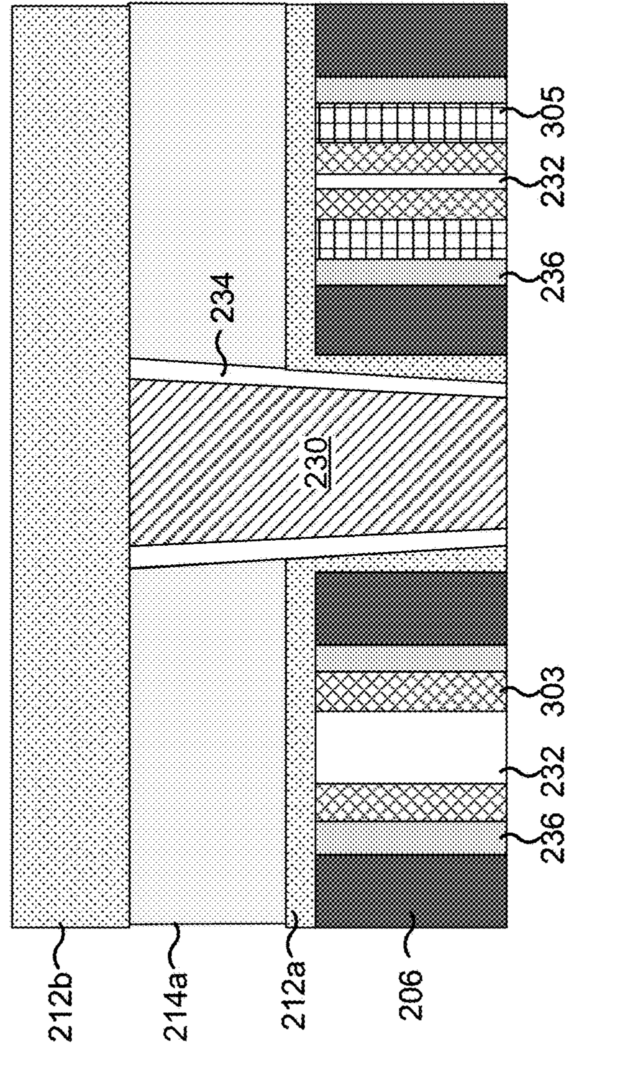

Accordingly, the MD 230 is formed before the seed layer 301 is deposited, which reduces or prevents lateral growth of the seed layer 301 toward the MD 230, as described below. As shown in FIG. 5F, an ESL 212*b* may be formed over the dielectric layer 214*a*. The deposition tool 102 may deposit the ESL 212*b* using a CVD technique, a PVD technique, an ALD technique, or another type of deposition technique. The planarization tool 110 may planarize the ESL 212*b* after the ESL 212*b* is formed.

Figure 5G:
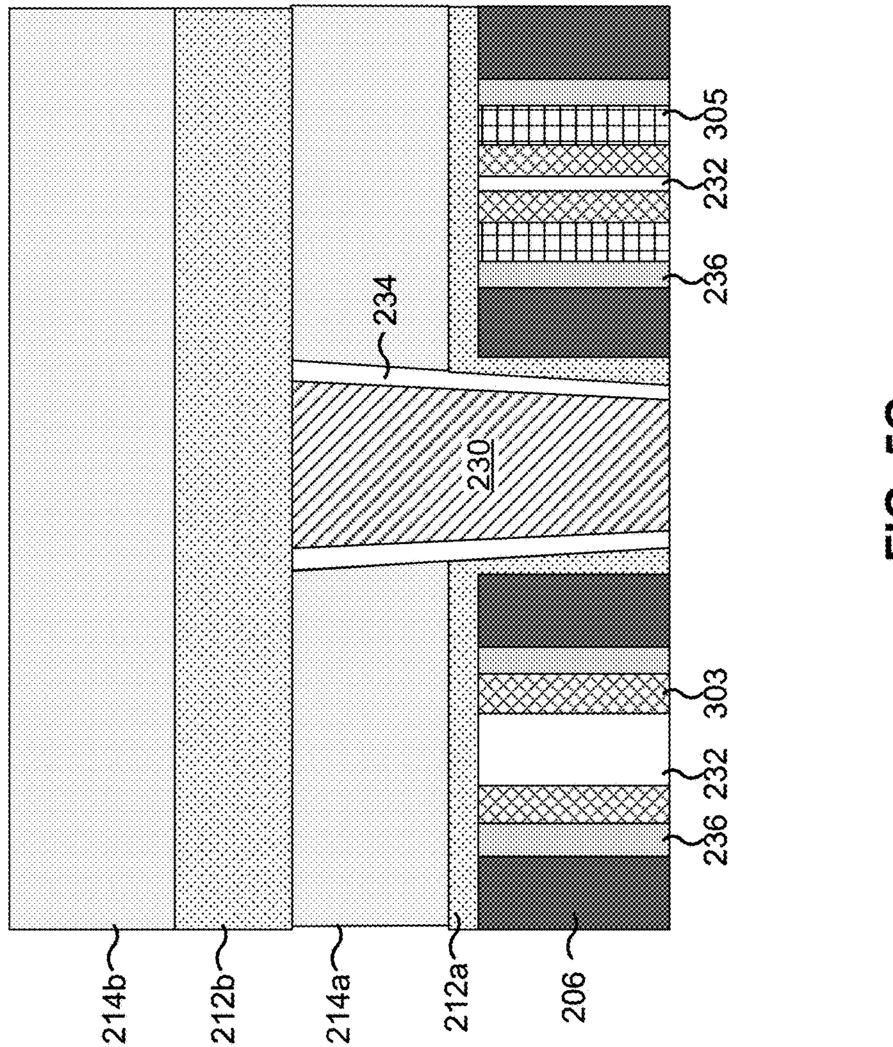

As shown in FIG. 5G, a dielectric layer 214*b* may be formed over the ESL 212*b*. For example, the deposition tool 102 may deposit the dielectric layer 214*b* using a CVD technique, a PVD technique, an ALD technique, or another type of deposition technique. The planarization tool 110 may planarize the dielectric layer 214*b* after the dielectric layer 214*b* is deposited.

Figure 5H:
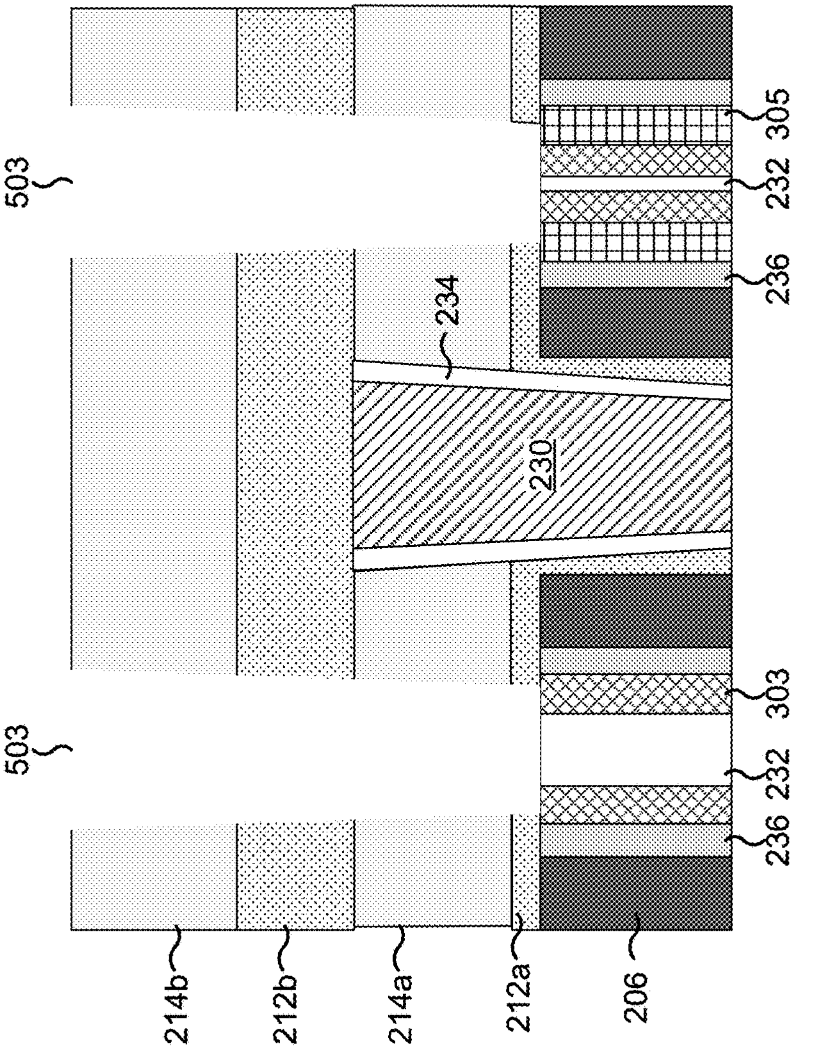

As shown in FIG. 5H, the dielectric layer 214*a* and the dielectric layer 214*b* may be etched to form openings adjacent to the MD 230 (results in recesses 503). In some implementations, surfaces of the gates 232 may be exposed. For example, the deposition tool 102 may form a photoresist layer on the dielectric layer 214*b* (or on an ESL formed on the dielectric layer 214*b*), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 214*b*. In some implementations, a photoresist removal tool removes the remaining portions of the photoresist layer (e.g., using a chemical stripper, a plasma asher, and/or another technique) after the etch tool 108 etches the dielectric layer 214*b*. For a dual damascene process, as shown in FIG. 5H, this etching cycle may be repeated for the dielectric layer 214*a*. Other implementations may use a single damascene process. Accordingly, some implementations may omit the ESL 212*b* and/or the dielectric layer 214*b*.

Figure 5I:
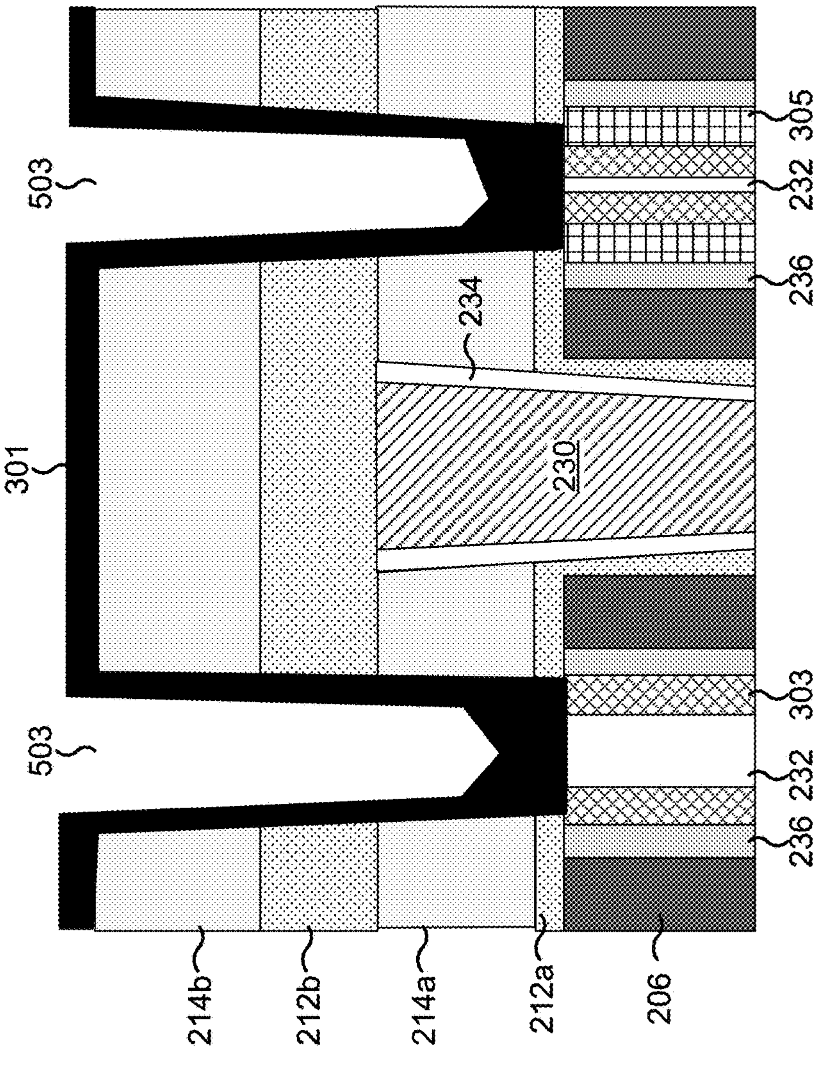

As shown in FIG. 5I, seed layers 301 may be formed in the recesses 503 (and over the dielectric layer 214*b*). The deposition tool 102 may deposit the seed layers 301 using a conformal CVD technique. Additionally, the seed layers 301 may be selected from materials that do not exhibit substrate dependency such that the deposition is super conformal. As a result, the seed layers 301 form thicker on bottom surfaces of the recesses 503 than on sidewalls of the recesses 503.

In some implementations, the seed layers 301 include ruthenium. Accordingly, the deposition tool 102 may use a precursor including $Ru(CO)_{12}$ with (or without) free carbon monoxide (CO). The deposition tool 102 may perform the deposition at a pressure in a range from approximately 0.005 Torr (T) to approximately 1 T and at a temperature in a range from approximately 150 degrees Celsius (° C.) to approximately 250° C. The deposition tool 102 may perform deposition until a time threshold is satisfied, where the threshold is selected based on a desired thickness of the seed layers 301 within the recesses 503.

In some implementations, the seed layers 301 include molybdenum. Accordingly, the deposition tool 102 may use a precursor including $MoCl_x$ with (or without) a co-reactant CHD. The deposition tool 102 may perform the deposition at a pressure in a range from approximately 0.5 T to approximately 50 T and at a temperature in a range from approximately 255° C. to approximately 295° C. The deposition tool 102 may perform deposition until a time threshold is satisfied, where the threshold is selected based on a desired thickness of the seed layers 301 within the recesses 503.

In some implementations, the seed layers 301 include tungsten. Accordingly, the deposition tool 102 may use a precursor including $WF_x$ with (or without) $SiH_4$. The deposition tool 102 may perform the deposition at a pressure in a range from approximately 0.1 T to approximately 50 T and at a temperature in a range from approximately 200° C. to approximately 450° C. The deposition tool 102 may perform deposition until a time threshold is satisfied, where the threshold is selected based on a desired thickness of the seed layers 301 within the recesses 503.

Figure 5J:
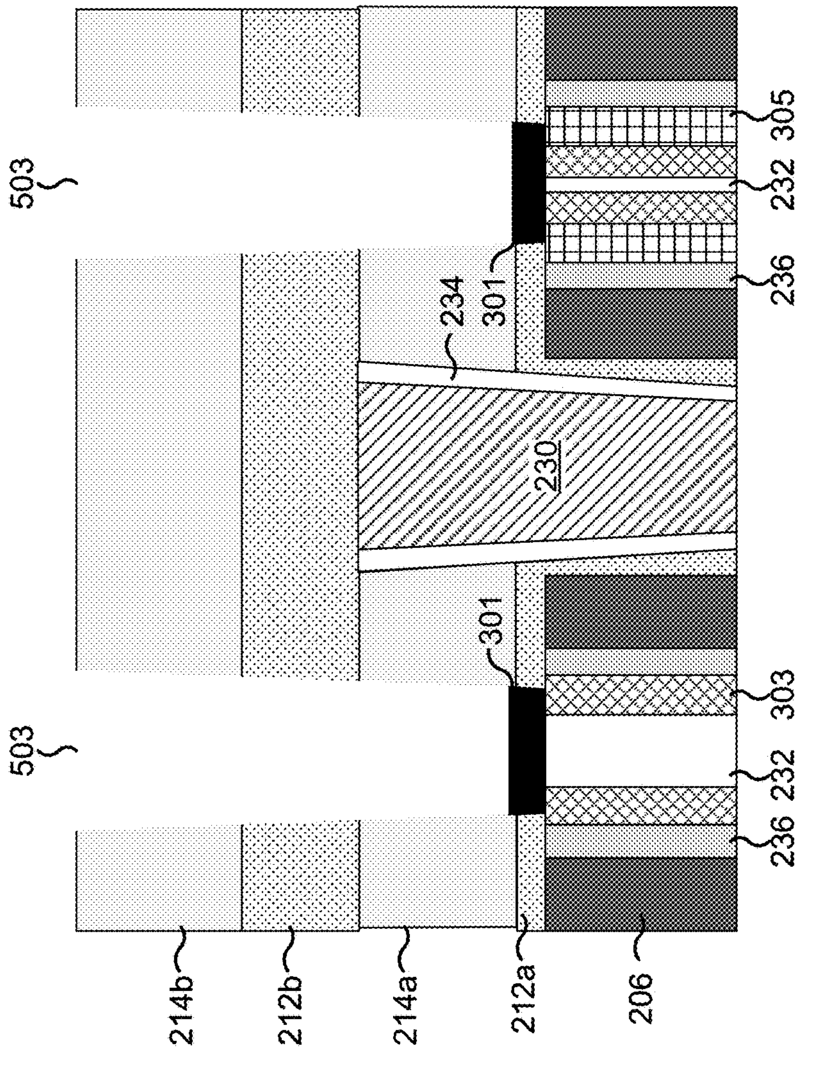

As shown in FIG. 5J, the seed layers 301 may be etched from sidewalls of the recesses 503 (and from a horizontal surface of the dielectric layer 214*b*). In some implementations, the etch tool 108 may use isotropic etching, which results in a remaining seed layer 301 on bottom surfaces of the recesses 503 but not on the sidewalls because the seed layer 301 was thicker on the bottom surfaces than on the sidewalls.

In some implementations, the etch tool 108 uses chlorine ($Cl_2$) plasma for etching. Accordingly, the etch tool 108 may use chlorine in a range from approximately 10 standard cubic centimeter per minute (sccm) to approximately 200 sccm, with (or without) oxygen ($O_2$) in a range from approximately 50 sccm to approximately 400 sccm. The etch tool 108 may use a plasma top radio frequency (RF) in a range from approximately 400 Watts (W) to approximately 800 W and a bias voltage in a range from approximately 0 Volts (V) to approximately 700 V. The etch tool 108 may perform the etching at a pressure in a range from approximately 1 milliTorr (mT) to approximately 50 mT and at a temperature from approximately 50° C. to approximately 120° C. The etch tool 108 may perform deposition until a time threshold is satisfied, where the threshold is selected based on a desired thickness of the seed layers 301 within the recesses 503.

In some implementations, the etch tool 108 uses ozone ($O_3$) plasma for etching. Accordingly, the etch tool 108 may use ozone in a range from approximately 100 grams per cubic meter ($g/m^3$) to approximately 500 $g/m^3$, with oxygen ($O_2$) in a range from approximately 8000 sccm to approximately 15000 sccm. The etch tool 108 may perform the etching with or without nitrogen ($N_2$). The etch tool 108 may perform the etching at a pressure in a range from approximately 1 T to approximately 5 T and at a temperature from approximately 150° C. to approximately 200° C. The etch tool 108 may perform deposition until a time threshold is satisfied, where the threshold is selected based on a desired thickness of the seed layers 301 within the recesses 503.

Figure 5K:
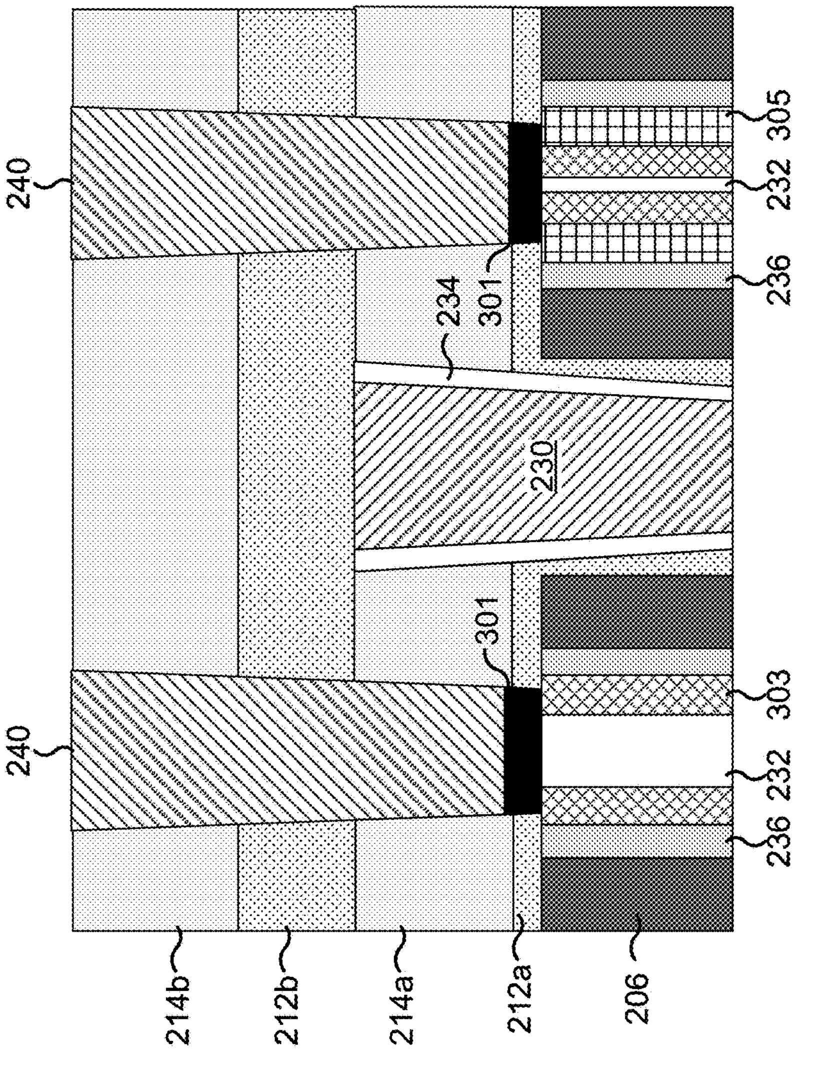

As shown in FIG. 5K, the gate vias 240 may be formed. The deposition tool 102 may deposit material of the gate vias 240 using a CVD technique, a PVD technique, an ALD technique, or another type of deposition technique, the plating tool 112 may deposit the material of the gate vias 240 using an electroplating operation, or a combination thereof.

In some implementations, the material of the gate vias 240 also flows over the dielectric layer 214*b*. Accordingly, the gate vias 240 may be planarized. The planarization tool 110 may planarize the gate vias 240 after the gate vias 240 is deposited. Additionally, portions of the gate vias 240 deposited over the dielectric layer 214*b* may be removed during planarization. In some implementations, the planarization tool 110 uses CMP.

Accordingly, the seed layers 301 allow formation of the gate vias 240 without seams, which reduces resistance of the gate vias 240. Additionally, the seed layers 301 are formed after the MD 230, which reduces or prevents lateral growth of the seed layers 301 toward the MD 230 and reduces or prevents voids from forming at an interface between the seed layers 301 and the gate vias 240. As a result, resistance is further decreased and current leakage toward the MD 230 is reduced or even prevented.

As indicated above, FIGS. 5A-5K are provided as an example. Other examples may differ from what is described with regard to FIGS. 5A-5K. For example, in some implementations, the additional layer 303 and/or the additional layer 305 may be omitted. Additionally, or alternatively, in some implementations, the ESL 212*a* and/or the ESL 212*b* may be omitted.

Figure 6:
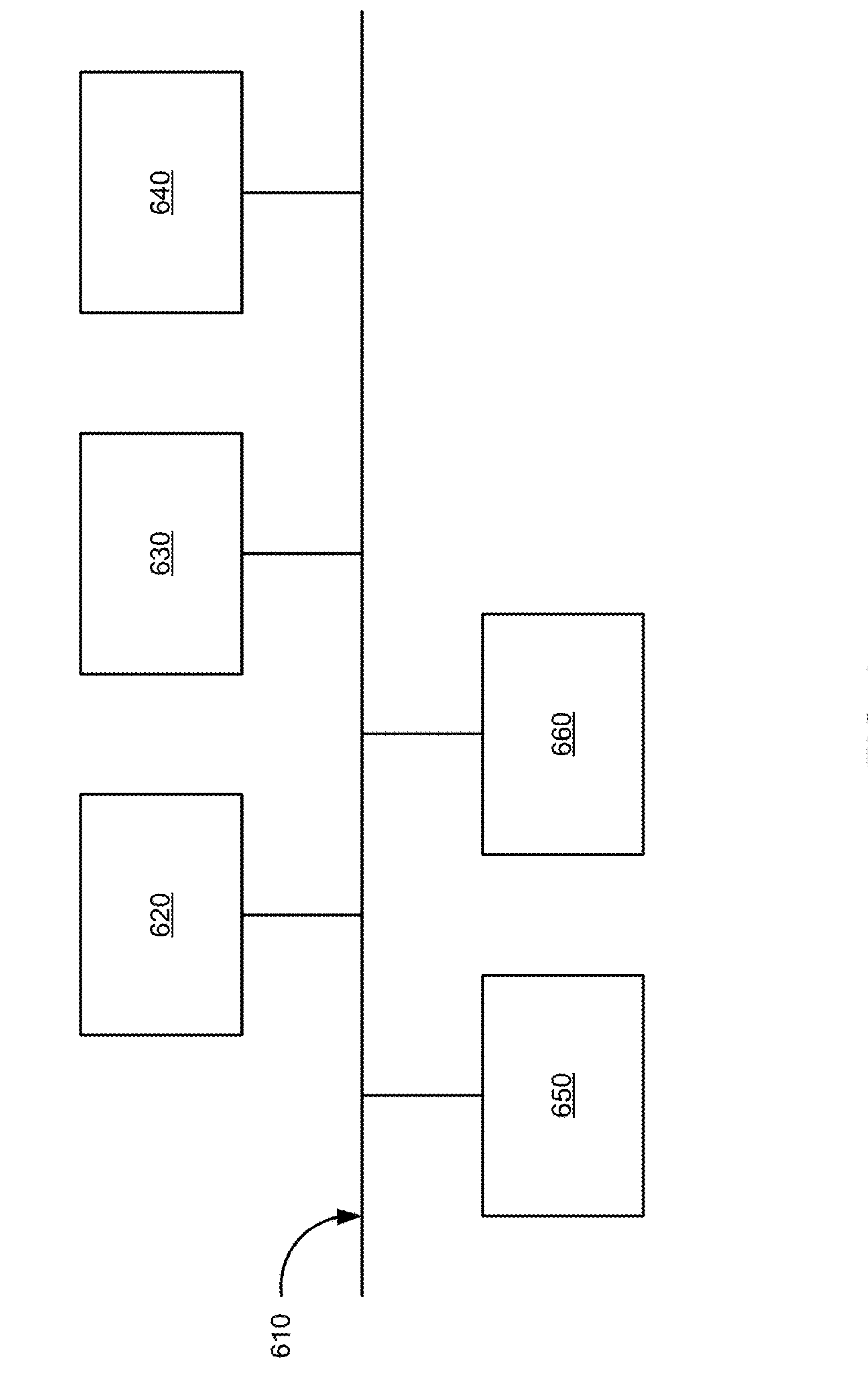
FIG. 6 is a diagram of example components of one or more devices of FIG. 1 described herein.

FIG. 6 is a diagram of example components of a device 600. In some implementations, one or more of the semiconductor processing tools 102-114 and/or the wafer/die transport tool 116 may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
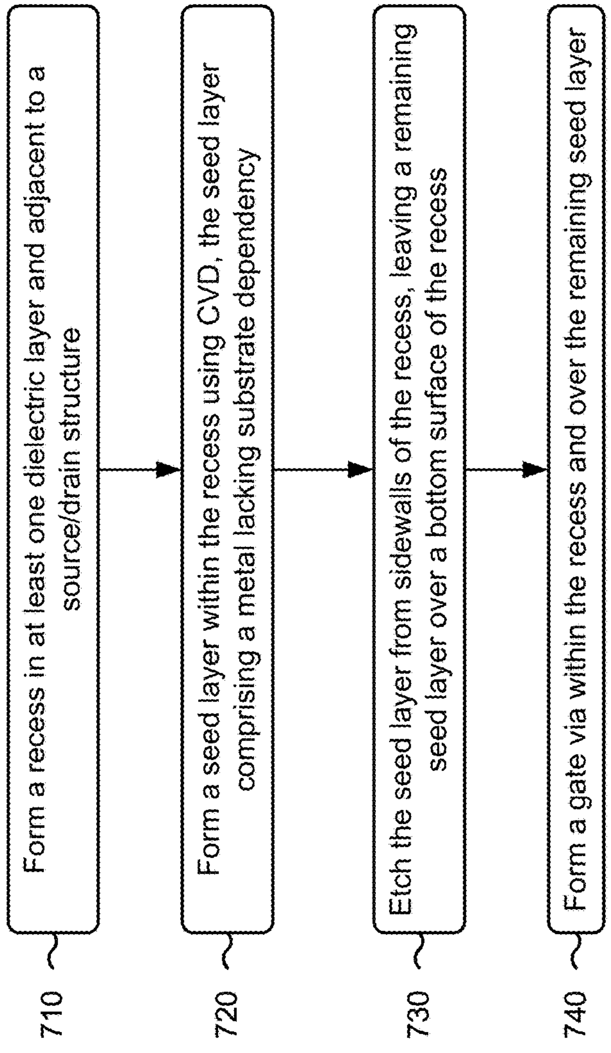
FIG. 7 is a flowchart of an example process associated with forming semiconductor structures described herein.

FIG. 7 is a flowchart of an example process 700 associated with forming conductive structures. In some implementations, one or more process blocks of FIG. 7 are performed by one or more semiconductor processing tools (e.g., one or more of the semiconductor processing tools 102-114). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a recess in at least one dielectric layer and adjacent to a source/drain structure (block 710). For example, the one or more semiconductor processing tools 102-114 may form a recess 503 in at least one dielectric layer 214 and adjacent to a source/drain structure 230, as described herein.

As further shown in FIG. 7, process 700 may include forming a seed layer within the recess using CVD, wherein the seed layer comprises a metal lacking substrate dependency (block 720). For example, the one or more semiconductor processing tools 102-114 may form a seed layer 301 within the recess 503 using conformal CVD, wherein the seed layer 301 comprises a metal lacking substrate dependency, as described herein.

As further shown in FIG. 7, process 700 may include etching the seed layer from sidewalls of the recess, wherein a remaining seed layer is over a bottom surface of the recess (block 730). For example, the one or more semiconductor processing tools 102-114 may etch the seed layer 301 from sidewalls of the recess 503, wherein a remaining seed layer 301 is over a bottom surface of the recess 503, as described herein.

As further shown in FIG. 7, process 700 may include forming a gate via within the recess and over the remaining seed layer (block 740). For example, the one or more semiconductor processing tools 102-114 may form a gate via 240 within the recess 503 and over the remaining seed layer 301, as described herein.

Process 700 may include additional implementations, such as any single implementation or any combination of implementations described below and/or in connection with one or more other processes described elsewhere herein.

In a first implementation, the seed layer is selected from ruthenium (Ru), molybdenum (Mo), tungsten (W), or a combination thereof.

In a second implementation, alone or in combination with the first implementation, the gate via is formed of a material selected from ruthenium (Ru), molybdenum (Mo), tungsten (W), aluminum (Al), titanium (Ti), titanium nitride (TiN), copper (Cu), cobalt (Co), or a combination thereof.

In a third implementation, alone or in combination with one or more of the first and second implementations, etching the seed layer 301 includes using a chlorine (Cl) or ozone ($O_3$) plasma to remove the seed layer 301 from the sidewalls of the recess 503, wherein a height of the remaining seed layer 301 is reduced by the etching.

In a fourth implementation, alone or in combination with one or more of the first through third implementations, process 700 further includes performing a CMP on a gate 232 below the gate via 240, and forming the source/drain structure 230 before forming the seed layer 301.

In a fifth implementation, alone or in combination with one or more of the first through fourth implementations, process 700 further includes performing a CMP on the gate via 240.

In a sixth implementation, alone or in combination with one or more of the first through fifth implementations, forming the seed layer includes performing CVD with a precursor selected from a ruthenium dodecacarbonyl, a molybdenum chloride, a tungsten fluoride, or a combination thereof.

In a seventh implementation, alone or in combination with one or more of the first through sixth implementations, forming the seed layer includes performing CVD with a co-reactant selected from carbon monoxide, a cyclohexanedione, silane, or a combination thereof.

In an eighth implementation, alone or in combination with one or more of the first through seventh implementations, forming the seed layer includes performing CVD at a temperature in a range from approximately 150° C. to approximately 450° C.

In a ninth implementation, alone or in combination with one or more of the first through eighth implementations, forming the seed layer includes performing CVD at a pressure in a range from approximately 0.005 T to approximately 50 T.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

In this way, depositing a seed layer after formation of the MD in order to reduce or prevent epitaxial growth of the seed layer toward the MD. For example, the seed layer may be deposited using CVD and conformal dry etching. In some implementations, the seed layer may be formed of ruthenium (Ru), molybdenum (Mo), or tungsten (W). Accordingly, the seed layer helps reduce or prevent seam formation in the VG, which reduces resistance of the VG by allowing for bottom-up metal growth. Additionally, current leakage from the VG to the MD is reduced or even prevented. As a result, device performance and efficiency are increased and breakdown voltage of the gate structure is also increased. Additionally, because electrical shorts are less likely, yield is increased, which conserves power, raw materials, and processing resources that otherwise would have been consumed during manufacture.

As described in greater detail above, some implementations described herein provide a method. The method includes forming a recess in at least one dielectric layer and adjacent to a source/drain structure. The method includes forming a seed layer within the recess using conformal chemical vapor deposition (CVD), wherein the seed layer comprises a metal lacking substrate dependency. The method includes etching the seed layer from sidewalls of the recess, wherein a remaining seed layer is over a bottom surface of the recess. The method includes forming a gate via within the recess and over the remaining seed layer.

As described in greater detail above, some implementations described herein provide a method. The method includes forming a recess in at least one dielectric layer and adjacent to a source/drain structure. The method includes forming a seed layer within the recess using conformal chemical vapor deposition (CVD) with a precursor selected from a ruthenium dodecacarbonyl, a molybdenum chloride, a tungsten fluoride, or a combination thereof. The method includes etching the seed layer from sidewalls of the recess, wherein a remaining seed layer is over a bottom surface of the recess. The method includes forming a gate via within the recess and over the remaining seed layer.

As described in greater detail above, some implementations described herein provide a semiconductor structure. The semiconductor structure includes a gate structure adjacent to a source/drain structure. The semiconductor structure includes a seed layer formed over the gate structure and comprising a first metal. The semiconductor structure includes a gate via formed over the seed layer, electrically connected to the gate structure through the seed layer, and comprising a second metal, where the gate via is substantially free of seams.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- forming a recess in at least one dielectric layer and adjacent to a source/drain structure,
  - wherein the recess exposes a portion of a top surface of a gate structure, and
  - wherein the recess is formed through an etch stop layer (ESL) that is on the top surface of the gate structure;
- forming a seed layer within the recess using conformal chemical vapor deposition (CVD), wherein the seed layer comprises a metal;
- etching the seed layer from part of sidewalls of the recess, wherein a remaining seed layer is over a bottom surface of the recess; and
- forming a gate via within the recess and over the remaining seed layer,
  - wherein a top surface of the remaining seed layer is higher than a top surface of the ESL, and
  - wherein a portion of the ESL is on a side surface of the remaining seed layer.

2. The method of claim 1,
wherein the seed layer is selected from ruthenium, molybdenum, tungsten, or a combination thereof.

3. The method of claim 1,
wherein forming the seed layer comprises:
performing CVD with a precursor selected from a ruthenium dodecacarbonyl, a molybdenum chloride, a tungsten fluoride, or a combination thereof.

4. The method of claim 1,
wherein forming the seed layer comprises:
performing CVD with a co-reactant selected from carbon monoxide, a cyclohexanedione, silane, or a combination thereof.

5. The method of claim 1,
wherein forming the seed layer comprises:
performing CVD at a temperature in a range from approximately 150 degrees Celsius (° C.) to approximately 450° C.

6. The method of claim 1,
wherein forming the seed layer comprises:
performing CVD at a pressure in a range from approximately 0.005 Torr to approximately 50 Torr.

7. The method of claim 1,
wherein the gate via is formed of a material selected from ruthenium, molybdenum, tungsten, aluminum, titanium, titanium nitride, copper, cobalt, or a combination thereof.

8. The method of claim 1,
wherein etching the seed layer comprises:
using a chlorine or ozone plasma to remove the seed layer from the part of the sidewalls of the recess, wherein a height of the remaining seed layer is reduced by the etching.

9. The method of claim 1, further comprising:

performing a chemical mechanical planarization on a gate structure below the gate via; and forming the source/drain structure before forming the seed layer.

10. The method of claim 1, further comprising:

performing a chemical mechanical planarization on the gate via.

11. The method of claim 1, wherein the remaining seed layer contacts the portion of the top surface of a gate structure.

12. A method, comprising:

forming a plurality of recesses in at least one dielectric layer and adjacent to a source/drain structure;

forming a seed layer within the recesses using conformal chemical vapor deposition (CVD) with a precursor selected from a ruthenium dodecacarbonyl, a molybdenum chloride, a tungsten fluoride, or a combination thereof;

etching the seed layer from part of sidewalls of the recesses, wherein remaining portions of the seed layer are over bottom surfaces of the recesses; and forming gate vias within the recesses and over the remaining seed layer, wherein a first recess of the plurality of recesses exposes a portion of a top surface of a first gate structure, wherein a second recess of the plurality of recesses exposes a portion of a top surface of a second gate structure, wherein the first recess and the second recess are formed through an etch stop layer (ESL) that is on the top surface of the first gate structure and the top surface of the second gate structure, wherein top surfaces of the remaining portions of the seed layer are higher than a top surface of the ESL, and wherein portions of the ESL are on side surfaces of the remaining portions of the seed layer.

13. The method of claim 12, wherein forming the seed layer comprises:

performing CVD with a co-reactant selected from carbon monoxide, a cyclohexanedione, silane, or a combination thereof.

14. The method of claim 12, wherein forming the seed layer comprises:

performing CVD at a temperature in a range from approximately 150 degrees Celsius (C) to approximately 450° C.

15. The method of claim 12, wherein forming the seed layer comprises:

performing CVD at a pressure in a range from approximately 0.005 Torr to approximately 50 Torr.

16. A method, comprising:

forming a gate structure adjacent to a source/drain structure;

forming a seed layer over the gate structure; and forming a gate via over the seed layer and electrically connected to the gate structure through the seed layer, wherein a bottom surface of the gate via has a width approximately equal to a width of a top surface of the seed layer, and the top surface of the seed layer is level with the bottom surface of the gate via, wherein the seed layer is formed through an etch stop layer (ESL) that is on a top surface of the gate structure, wherein a top surface of the seed layer is higher than a top surface of the ESL, and wherein a portion of the ESL is on a side surface of the seed layer.

17. The method of claim 16, wherein forming the seed layer comprises:

forming the seed layer within a recess; and etching the seed layer from part of sidewalls of the recess, wherein a remainder of the seed layer is over a bottom surface of the recess.

18. The method of claim 16, wherein the seed layer is formed using conformal chemical vapor deposition (CVD).

19. The method of claim 18, wherein the seed layer comprises a metal.

20. The method of claim 18, wherein the conformal CVD is performed with a precursor selected from a ruthenium dodecacarbonyl, a molybdenum chloride, or a tungsten fluoride.

* * * * *